US006876271B2

(12) United States Patent
Evers et al.

(10) Patent No.: US 6,876,271 B2
(45) Date of Patent: Apr. 5, 2005

(54) MICROWAVE SWITCHING WITH ILLUMINATED FIELD EFFECT TRANSISTORS

(75) Inventors: Christian Evers, Kirchheim (DE); Wolfgang Cohrs, Poing (DE); Gerd Hechtfischer, Munich (DE); Martin Hassler, Munich (DE); Thomas Will, Pfaffenhofen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 104 days.

(21) Appl. No.: 10/603,052

(22) Filed: Jun. 24, 2003

(65) Prior Publication Data

US 2004/0036462 A1 Feb. 26, 2004

(30) Foreign Application Priority Data

Jun. 27, 2002 (DE) ......................................... 102 28 810

(51) Int. Cl.[7] .............................................. H03H 11/24
(52) U.S. Cl. ..................... 333/81 A; 333/170; 333/28 R
(58) Field of Search ............................ 333/81 A, 170, 333/28 R

(56) References Cited

U.S. PATENT DOCUMENTS 5,157,323 A    10/1992  Ali et al.

FOREIGN PATENT DOCUMENTS

DE    692 18 040 T2    11/1992

OTHER PUBLICATIONS

De Salles, *IEEE Transactions on Microwave Theory and Techniques*, vol. MTT–31, No. 10, "Optical Control of GaAs MESFET's"(Oct., 1983).
Simons, *IEEE Transactions on Microwave Theory and Techniques*, vol. MTT–34, No. 12, "Analysis of Optically Controlled Microwave/Millimeter–Wave Device Structures" (Dec., 1986).

*Primary Examiner*—Don Le
(74) *Attorney, Agent, or Firm*—Caesar, Rivise, Bernstein, Cohen & Pokotilow, Ltd.

(57) ABSTRACT

An electronic microwave circuit (1) with field effect transistors which are integrated on at least one semiconductor chip (2), has a light source (3), which radiates the field effect transistors with light and possesses a housing (6) which encloses in a microwave excluding manner the semiconductor chip (2) and the light source (3) or a light conducting means (8) connected with the light source (3).

20 Claims, 3 Drawing Sheets

MICROWAVE SWITCHING WITH ILLUMINATED FIELD EFFECT TRANSISTORS

BACKGROUND OF THE INVENTION

The invention concerns a microwave circuit with field effect transistors, which circuit especially, but not exclusively, is designed as a damping circuit.

Damping circuits are, for example, applied in high frequency technology for the purposes of measuring and control of levels in sending equipment and mobile radio apparatuses. In order, for example, to be able to quickly run through measurement sequences with different, changing parameters, the damping circuit, that is to say, the damping elements which are to be found therein, must be switched in very rapidly and possess a wide breadth of dynamics.

For instance, such a damping element circuit has been made known by U.S. Pat. No. 5,157,323. The digitally controlled damping member disclosed therein is constructed with field effect transistors used as switching elements.

This digital damping member of U.S. Pat. No. 5,157,323 is found disadvantageous on the basis of the relatively long switching time of the field effect transistors.

On this account, it is the purpose of the invention to make known a rapid, electronic microswitching action, integrated on a semiconductor chip using field effect transistors.

SUMMARY OF THE INVENTION

In accord with the invention, field effect transistors, which are integrated on a semiconductor chip, are subjected to light radiation from a light source. This action is within a housing, impenetrable to foreign microwaves, which housing shields the microwaves of the enclosed circuit and encapsulates the light source or one (or more) of the light wave conductors which may be associated with the said light source.

Field effect transistors, as is well known, are very easily made effective on a semiconductor chip. Beyond this, they require but little control power. The radiation of light onto field effect transistors, in keeping with the invention, brings about the result, that fault centers can be more quickly reversed in charge. These fault centers occur on the semiconductor border areas and especially beneath the gate-electrode, and have a negative effect on the switching times of the field effect transistors.

The negative influence of the fault center points is known in the case of metal semiconductor field effect transistors (hereinafter, "MESFET") components, as "Gate Lag Effect". This is the most slow changing of external resistance, which can be measured. The cause is the slow ON/OFF charging of surface fault centers of the source-gate stretch and the gate drain stretch. By means of the illumination radiated to the field effect transistors, electron hole pairs are created, which neutralize the captured charges in the fault centers. This illumination brings about the effect, that the gate-lag is repressed and the switching time is shortened by a factors of from 10 to 100.

Advantageous developments arise from the subordinate claims.

In accord with one development of the invention, the field effect transistors are designed as MESFET types which employ as a gate channel transition a metal semiconductor transition without oxide, especially Ga-Ar-MESFET, that is, a MESFET which is constructed on a gallium/arsenide substrate. These are known for their excellent high frequency characteristics.

In accord with another development, the light source subjects the field effect transistors to a polychromatic light, that is, with a light consisting of a plurality of wave lengths or one or more wavelength ranges. This development makes it quite possible to install simple and cost saving light sources. The construction of the light source as a light emitting diode (LED) is advantageous, since LEDs have a long operating life, are subject to insignificant losses and are economical. With a LED designed as a Surface Mounted Device (SMD), one can also achieve an improvement in mounting friendliness. Beyond this, advantageous light sources can be halogen, xenon gas discharge or laser based illumination. Such illuminators allow high intensity of light and excellent lighting yields.

Likewise advantageous, is the technique of directing the radiation emitted by the light source onto the field effect transistors by means of a light-wave conductor. In this way, the light source can be placed remote from the field effect transistors. In this manner, the placement of the light source can be chosen with greater flexibility so that the light source can be located entirely outside of the housing. Thus, the power dissipation of the light given off by the light source cannot have any influence on the circuit integrated on the semiconductor. Again, the friendliness of the mounting is considerably increased.

The housing, provided for protection from interfering microwave radiation, is advantageously designed to be not only impervious to light but also is sealed against entry of air. In this way, disturbing ambient light interference can be avoided, while at the same time, radiation intensity to the field effect transistors can be especially easily and precisely regulated. Among other things, the air-tight closure of the housing assures that no foreign bodies can infiltrate into the housing and over-shadow the field effect transistors.

A multipiece design of the housing offers advantages in regard to mounting and repair friendliness, since, for example, direct current operations and high frequency operation can be carried out in spatially separated chambers.

The installation of the light source on a circuit board, which board is placed above a semiconductor chip on two supports standing on a substrate, presents a simple and thereby economical construction variant. This can be further improved, in that the support members contribute to the function of the circuit, wherein they, for example, can be designed as series resistances for the operation of the source of light.

BRIEF DESCRIPTION OF SEVERAL VIEWS OF THE DRAWINGS

In the following, the invention will be explained in greater detail with the aid of a schematic drawing of embodiment examples. The same components are provided with the same reference numbers. The drawings show in.

DETAILED DESCRIPTION OF THE INVENTION

Figure 1:
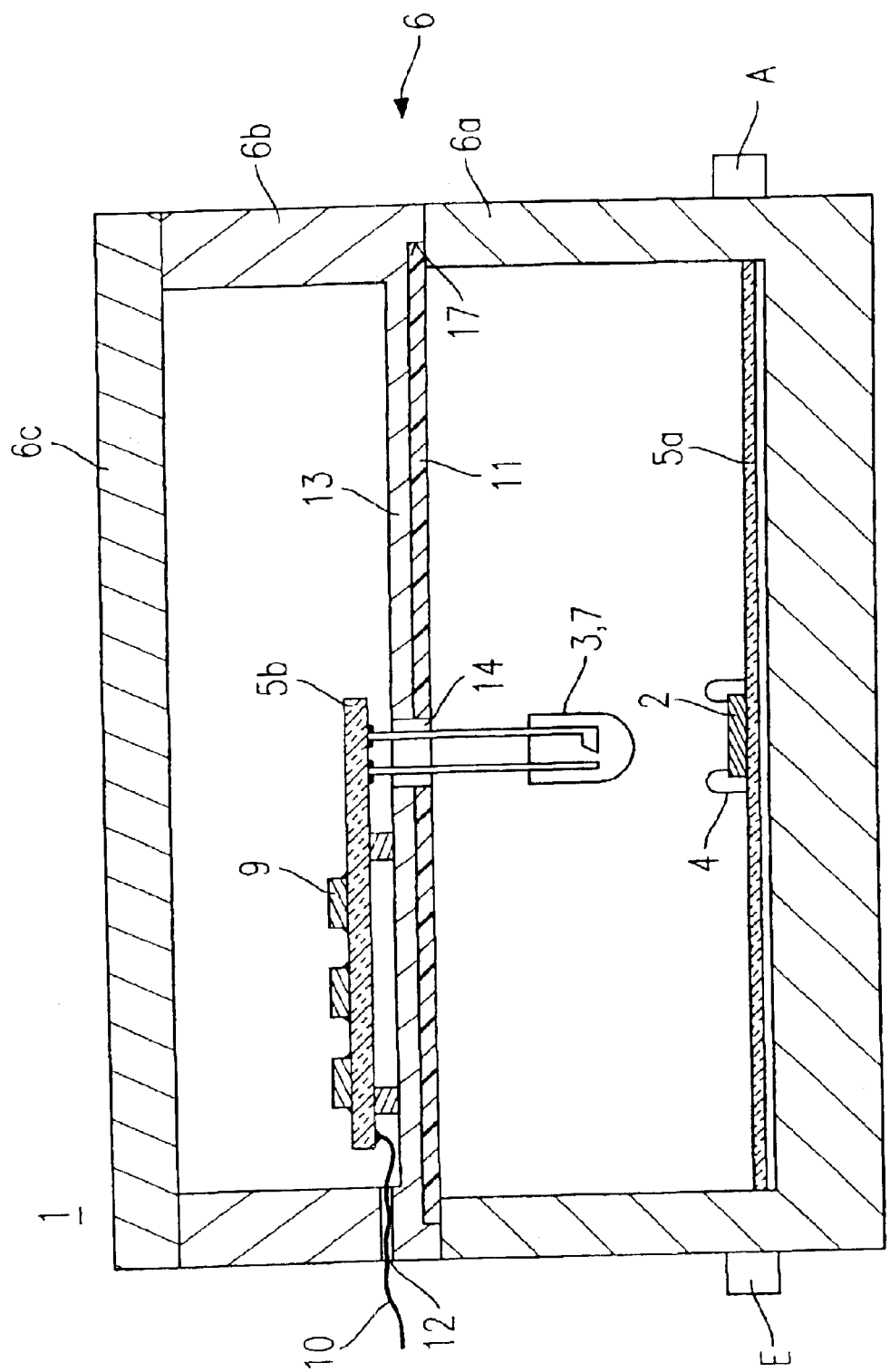
FIG. 1 a schematically presented design of an invented microwave circuit and the spatial arrangement of the components in a multipiece housing corresponding to a first embodiment, FIG. 2 a schematically presented design of an invented microwave circuit and the spatial arrangement of the components in a housing with a light conductor from a light source, corresponding to a second embodiment, FIG. 3 a schematically presented design of an invented microwave circuit with a SMD-light emitting diode and the spatial arrangement of the components, corresponding to a third embodiment and in FIG. 4 a principal circuit diagram of an embodiment of an invented embodiment of an invented microwave circuit in the form of a damping circuit.

FIG. 1 shows an invented embodiment example of the electronic microwave circuit 1. A boxlike housing 6, depicted in sectional presentation, consists of a lower housing part 6a and an upper housing part 6b, wherein the bottom of lower housing part 6a holds a plate shaped substrate 5a. The semiconductor chip 2, which, for instance, possesses a damping circuit integrated thereupon, is mounted on the said substrate 5a. The said chip 2 is electrically connected by two contacting wires 4, which wires are in turn connected to (not shown) conductor paths running on the substrate 5a. Input E and output A which are connected to the circuit which is integrated on the semi conductor chip 2 are led to the outside through the lower housing piece 6a in microwave protected conductors.

The two boxlike housing pieces 6a, 6b are bound together with a cover piece 6c to exclude external, interfering microwaves. The interior chamber is separated by a bottom 13 of the upper housing piece 6b, wherein this said bottom 13 possesses a recess 17 proximal to the lower housing piece 6a, which extends itself over a large part of the surface of the bottom 13 and into which a matted damping body 11 is inserted for the damping of occurring electromagnetic waves in the in the lower housing piece 6a.

In this bottom 13 and in the damping body 11 is to be found an opening 14, through which are led electrical connections of a light source 3, which comprises a light emitting diode 7. The light emitting diode 7 is affixed to a circuit board 5b installed in the upper housing piece 6b on the bottom 13 thereof, and said light emitting diode 7 is in electrical contact with conducting paths (not shown) on the circuit board 5b. The light emitting part of the light emitting diode 7 is within the lower housing piece 6a above that side of a semiconductor chip 2 which is remote from the substrate 5a. In this position the light emitting diode 7 radiates on to the field effect transistors T1–T12 (see FIG. 4) which are integrated on the semiconductor chip 2. Because of the light impervious nature of the housing 6, the radiation of the field effect transistors T1–T12 depends essentially only on the characteristics of the light emitting diode 7, its spatial position, and its electrical control. In this way, the radiation can be made very exact and easily controlled.

On the circuit board 5b are located other electronic components 9, such as, for example, series resistances for the operation of the light emitting diode 7. An electrical connection 10 serves, in this embodiment, for power supply of the light emitting diode 7 and enters the upper housing 6b through a microwave sealed, bushing opening 12.

The sealing of the bushing opening 12 against microwaves is, for example, achieved by the limitation of the bushing opening diameter as to its dimensions, anyone of which is clearly less than the smallest wavelength employed in electronic microwave circuit 1. Even a lengthening of the bushing opening or a corresponding shaping of the course of the bushing opening 12 can act as a signal damper and thus improve the sealing against microwave intrusion. If necessary, it can be required to seal the two housing pieces 6a, 6b against one another in a microwave tight manner, wherein, then, for the opening 14 the same measures are taken as were used for the bushing opening. 12. Further, in this case, the electrical connections of the light emitting diode 7 in the opening 14 are brought through in an electrically insulated manner.

Figure 2:
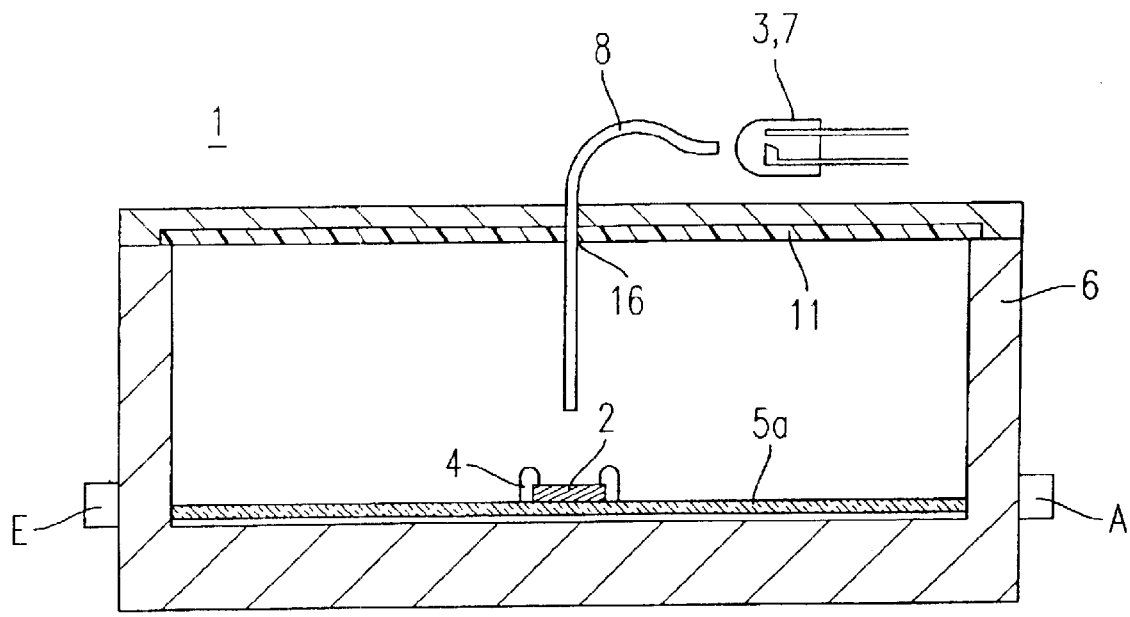

FIG. 2 shows an additional embodiment of the invented microwave circuit 1 with a boxlike housing 6, which encloses the plate shaped, substrate 5a with a semiconductor chip 2 placed thereon and protected from foreign microwave interference. In this case, the semi conductor chip 2, by means of the (not shown) conductor paths on the substrate 5a is electrically connected through contact wires 4. The input E and the output A of the microwave circuit 1 penetrate the housing 6, properly protected against foreign microwave intrusion.

In this embodiment example, the light source 3, consisting of a light emitting diode 7 is located outside of the housing 6 and is in connection with a light wave conductor 8 in such a manner, that a major portion of the emitted light from the light source 3 enters into the said light conductor 8. The light conductor 8 is led, microwave sealed, through one side of the housing 6 including the thereon internally attached, mattlike damping body 11. The penetrative entry is through a bushing opening 16 which is placed on the side remote from the substrate 5a, which carries the semiconductor chip 2. The light conductor then terminates immediately before the semiconductor chip 2.

The microwave sealing of the bushing opening 16 is done in the manner already described in relation to FIG. 1, wherein the diameter of the bushing opening 16 is so small dimensioned, that the lower threshold frequency of the bushing opening 16, which acts as a hollow resonator, lies above the maximal operating frequency of the microwave circuit 1. The light wave conductor 8 can also be integrated with a metal tube installed in the housing top 6c, which fixes the end position of the light wave conductor 8 above the semiconductor chip 2. Advantageously, then tube again has such a small diameter, that the tube and the light wave conductor—seen as a dielectric—form a resonate cavity which has a low frequency, which is above that of the maximum occurring operational frequency of the microwave circuit 1. The advantage of the placement of the light source 3 outside of the housing 6 is to be found, principally, in the possibilities for the installation of more powerful light sources 3.

Figure 3:
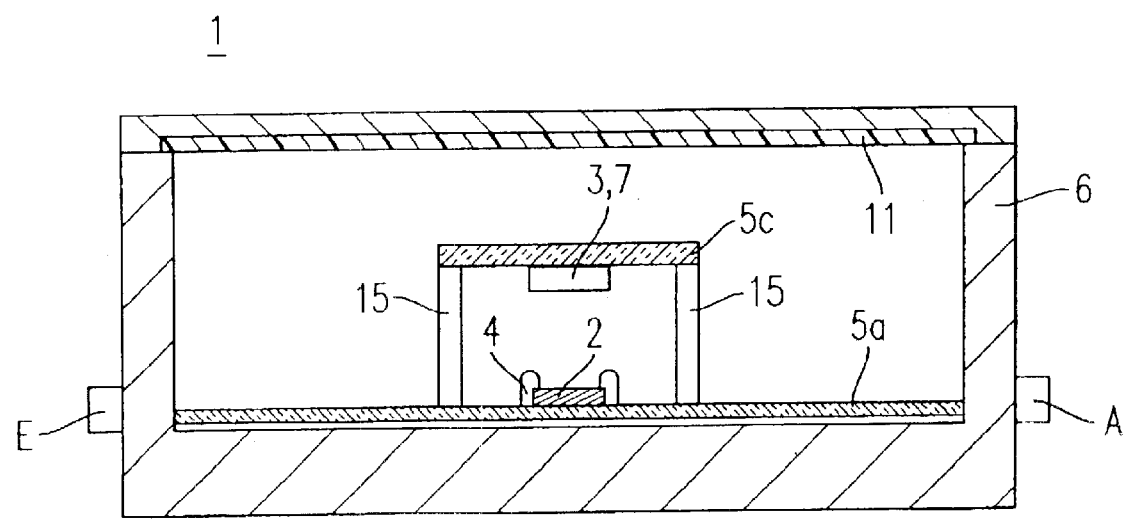

FIG. 3 shows an embodiment example which is essentially similar to that of FIG. 2, without the light wave conductor 8 and the therewith accompanying bushing opening 16. However, in the housing 6, above that side of the semiconductor chip 2 which is remote from the substrate 5a, a circuit board 5c is installed. The circuit board 5c is held by two supports 15 above the substrate 5a and carries a light emitting diode 7 in SMD-construction, whereby the circuit board 5c further bears a (not shown) circuit for the operation of the light emitting diode 7.

Figure 4:
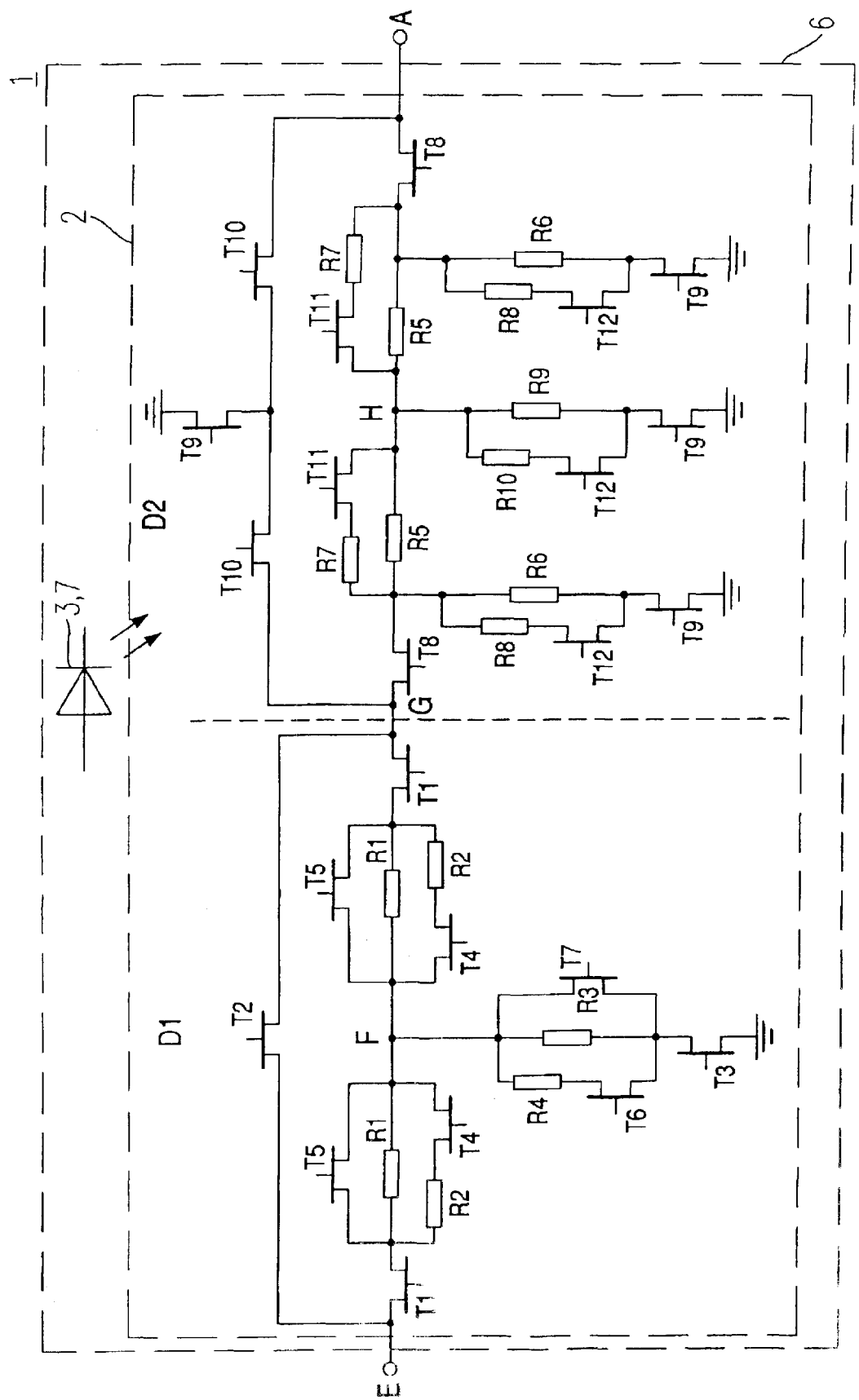

FIG. 4 presents the principle diagram of an electronic microwave circuit 1 in its entirety in the form of a damping circuit. The microwave circuit (1) is encompassed by a housing 6, which in turn encloses, with external microwave exclusion, two damping members D1 and D2 connected in tandem and integrated on a semiconductor chip 2, these said members being placed between an input entry E and an output exit A. The input E and the output A of the microwave circuit 1 are connected to the outside from the semiconductor chip 2 through the housing 6.

A source of light 3, which is in this embodiment is designed as a light emitting diode 7, radiates, with light of polychromatic wave lengths, the field effect transistors T1–T12, which are integrated on the semiconductor chip 2.

The damping member D1 is designed as a T-circuit and consists of a plurality of resistances R1 to R4, which, respectively, by means of the field effect transistors T1 to T7, can be switched to various resistance values. The second damping member D2 is constructed as a double-pi-circuit and comprises a plurality of resistances R5 to R10, which, once again, by means of the field effect transistors T8 to T12 can be switched together to yield various resistances. The resistances shown by the same reference number are correspondingly equally sized in values. The field effect transistors with the same reference numbers can be respectively simultaneously switched ON or OFF.

The field effect transistors T3 and T9 of the damping members D1, D2, serve the purpose, of diverting the respective damping part from the signal path. Advantageously, to the same end, additional field effect transistors T1 and T8 are provided, which assure a better mutual responsiveness, when the 0 dB-conditions of the damping members D1, D2 are switched in.

A field effect transistor T2 is placed between the input E and the output G of the first damping member D1. The T-member can be switched through three different resistance values. The left and right parts of the series branch between input E and the connection point F, as well as between connection point F and the output G consist respectively of a parallel circuit of resistance R1, a series connection of a resistance R2 and a field effect transistor T4, as well as a field effect transistor T5 which bridges the resistance R1. The cross branch of the T-member consists of a parallel circuit including a resistance R3, a bypass of this resistance R3 by a resistance R4, which is accompanied by a field effect transistor T6, as well as a bridging field effect transistor T7. The greatest resistance of the series branch of the damping member D1 is defined by the series connecting of the resistances R1. A medium resistance can be achieved, in that the resistance R2 is switched in parallel to the resistance R1, by means of the field effect transistor T4. The least resistance is brought about by the parallel connection of R1, R2 and the source-drain-stretch of the field effect transistors T5. By appropriate selection of the field effect transistors together with the remaining resistances R1 to R4, the most different, optional resistance values can be achieved. The source-drain-resistance of a field effect transistor lies, for instance, between 2 Ohm and 20 Ohm, the resistances of R1 to R4 lie, in this embodiment, in the general order of 10 to 100 Ohms.

With the damping member D1 configured in this manner, the damping values 0, 5, 10 and 15 dB can be attained:

| | |
|---|---|
| 0 dB: | T2 is switched on, all other field effect transistors are switched off, |
| For damping: | T2 is switched off and T1, i.e. T3 are switched on, 5 dB in the series branch the smallest resistance is switched on, the transverse branch, the greatest, that means, that T4 and T5 are switched on and T6 and T7 are respectively switched off, |
| 10 dB | T4 and T6 are switched on, T5 and T7 and switched off, and |
| 15 dB | T4 and T5 are switched off, T6 and T7 are switched on. |

In the damping member D2, in a similar manner, various resistance values with toggled switching conditions are available for the double-pi-circuit. The series branch of the double-pi-circuit between the (now) input G and output A, between the two series transistors T8 consists of the series connection of the two resistances R5. Parallel to these is placed, respectively, the series connection of a resistance R7 with a field effect transistor T11. The three transverse branches of the double-pi-circuit consists of the resistances R6 and R9. Parallel to the resistances R6 is placed the series connection of a resistance R8 and field effect transistor T12. Parallel to the resistance R9 of the middle transverse branch, is placed the series connection of a resistance R10 and a field effect transistor T12. The transverse branches are respectively switched to ground by the transistor T9.

For the setting of the throughput damping to zero, (0 dB), in the damping member D2, instead of only one single field effect transistor, there has been provided a T-configuration composed of three field effect transistors T9 and T10. For the throughput damping, the ground connected transistor T9 is non-conducting and the damping member D2 is thus bridged over between the circuit terminals G and A by the series connections of the two transistors T10. In the case of non-conducting transistors T10 and the adjustment of the different damping values by the resistance 5, the transistor T9 is made conductive to the ground. By this action the insulation of the bridging is increased and the damping member D2 can be sized for greater damping values.

With this circuit configuration, the damping member D2 can again be set for the following damping values 0, 20, and 30 dB:

| | |
|---|---|
| 0 dB | T10 is switched on, all other field effect transistors are switched off, |
| | for damping, T10 is switched off, T8 and T9 are switched on, |
| 20 dB | T11 is switched on, T12 is switched off, and |
| 30 dB | T11 is switched off, T12 is switched on. |

The damping member D1 thus can be toggled completely between the low damping values 0/5/10/15 dB, the damping member D2 which follows thereafter can achieve the values 0/20/30 dB, so that the entire arrangement of the two, series connected, damping members D1 and D2 can be toggled in 5 steps between 0 and 45 dB, The throughput damping is only determined by the series connection of the two bridging field effect transistors T2, that is T9/T10, and its value lies in the general magnitude of being less than 2 dB. The individual field effect transistors are so controlled by a control circuit (not shown), that the different above mentioned switching configurations of the resistances are possible. The two damping members D1 and D2 are respectively adjusted to be independent of one another.

We claim:

1. An electronic microwave circuit comprising:
   at least one semiconductor chip;
   field effect transistors which are integrated upon the at least one semiconductor chip;
   a light source adapted to radiates the field effect transistors with light; and
   a housing which, in a microwave excluding manner, encloses the at least one semiconductor chip and the light source or an optional light wave conductor which is connected to the light source.

2. The electronic microwave circuit of claim 1, wherein the field effect transistors, metal semiconductor field effect transistors.

3. The electronic microwave circuit of claim 1, wherein the light source radiates the field effect transistors with polychromatic light.

4. The electronic microwave circuit of claim 1, wherein the light source comprises at least one light emitting diodes.

5. The electronic microwave circuit of claim 1, wherein the light source comprises an illumination of xenon, halogen or of gas discharge means.

6. The electronic microwave circuit of claim 1, wherein the light wave conductor is adapted to diverts at least a portion of the light from the light source onto the field effect transistors.

7. The electronic microwave circuit of claim 6, wherein the light source is placed outside of the housing.

8. The electronic microwave circuit of claim 4, wherein the at least one light emitting diode is designed as a surface mounted device (SMD).

9. The electronic microwave circuit of claim 1, wherein the housing is impervious to light and/or is sealed against infiltration of air.

10. The electronic microwave circuit of claim 1, wherein the microwave circuit forms a damping circuit.

11. The electronic microwave circuit of claim 10, wherein between an input and an output, at least two damping members are connected in series, and damping of the at least two damping members can be adjusted among several different values by a toggling connection of a plurality of resistances by the field effect transistors to T-circuitry, T-bypassing circuitry, pi circuits, double pi circuitries, or double T circuits.

12. The electronic microwave circuit of claim 1, wherein the electronic microwave circuit forms one or more toggle circuits.

13. The electronic microwave circuit of claim 1, wherein the housing comprises a lower housing part and an upper housing part.

14. The electronic microwave circuit of claim 13, wherein the at least one semiconductor chip is mounted on a substrate installed in the lower housing part.

15. The electronic microwave circuit of claim 13, wherein the light source is mounted on a circuit board in the upper housing part.

16. The electronic microwave circuit of claim 14, wherein the at least one semiconductor chip is mounted upon the substrates and above the at least one semiconductor chip is installed a circuit board and the light source by at least one supporting element based on the substrate.

17. The electronic microwave circuit of claim 16, wherein the at least one supporting element is an electronic component.

18. The electronic microwave circuit of claim 1, wherein the field effect transistors are metal semiconductor field effect transistors constructed on a gallium/arsenide substrate.

19. The electronic microwave circuit of claim 1, wherein the electronic microwave circuit forms one or more arrangements of single port, double throw circuits.

20. The electronic microwave circuit of claim 16, wherein the at least one supporting element is a series resistance.

* * * * *